(12) United States Patent
Zhang

(10) Patent No.: US 11,495,641 B2
(45) Date of Patent: Nov. 8, 2022

(54) DISPLAYING BASE PLATE AND FABRICATING METHOD THEREOF, AND DISPLAY PANEL

(71) Applicant: BOE Technology Group Co., Ltd., Beijing (CN)

(72) Inventor: Zhenqi Zhang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 66 days.

(21) Appl. No.: 17/191,045

(22) Filed: Mar. 3, 2021

(65) Prior Publication Data

US 2022/0037424 A1   Feb. 3, 2022

(30) Foreign Application Priority Data

Jul. 29, 2020   (CN) .......................... 202010744440.3

(51) Int. Cl.
  *H01L 29/08*   (2006.01)
  *H01L 27/32*   (2006.01)
  *H01L 51/50*   (2006.01)
  *H01L 51/56*   (2006.01)
  *H01L 51/00*   (2006.01)

(52) U.S. Cl.
  CPC ........ *H01L 27/3211* (2013.01); *H01L 51/502* (2013.01); *H01L 51/56* (2013.01); *H01L 51/0013* (2013.01)

(58) Field of Classification Search
  CPC .......................... H01L 33/504; H01L 27/3211
  See application file for complete search history.

(56) References Cited

U.S. PATENT DOCUMENTS

| | | | |
|---|---|---|---|
| 2016/0204369 A1* | 7/2016 | Ferrini | H01L 51/447 |
| | | | 136/256 |
| 2018/0219185 A1* | 8/2018 | Liu | H01L 51/5056 |
| 2019/0086733 A1* | 3/2019 | Min | H01L 33/502 |
| 2019/0097101 A1* | 3/2019 | Dorman | C04B 35/584 |
| 2019/0115492 A1* | 4/2019 | Tamma | H01L 33/20 |
| 2019/0198728 A1* | 6/2019 | Tamma | H01L 33/505 |
| 2019/0348577 A1* | 11/2019 | Pathak | H01L 33/0075 |

* cited by examiner

*Primary Examiner* — Caleb E Henry
(74) *Attorney, Agent, or Firm* — WHDA, LLP

(57) ABSTRACT

A displaying base plate including multiple pixels. The first sub-pixel includes a first electrode, a first inorganic layer and a first quantum-dot layer sequentially stacked; the first inorganic layer includes a first inorganic material modified by a first group, and the first quantum-dot layer includes a first quantum dot modified by a first ligand; the second sub-pixel includes a second electrode, a second inorganic layer and a second quantum-dot layer sequentially stacked; the second inorganic layer includes a second inorganic material modified by a second group, and the second quantum-dot layer includes a second quantum dot modified by a second ligand; the third sub-pixel includes a third electrode, a third inorganic layer and a third quantum-dot layer sequentially stacked; and the third inorganic layer includes a third inorganic material modified by a third group, and the third quantum-dot layer includes a third quantum dot modified by a third ligand.

18 Claims, 1 Drawing Sheet

DISPLAYING BASE PLATE AND FABRICATING METHOD THEREOF, AND DISPLAY PANEL

CROSS REFERENCE TO RELEVANT APPLICATIONS

The present disclosure claims the priority of the Chinese patent application filed on Jul. 29, 2020 before the Chinese Patent Office with the application number of 202010744440.3 and the title of "DISPLAYING BASE PLATE AND FABRICATING METHOD THEREOF, AND DISPLAY PANEL", which is incorporated herein in its entirety by reference.

TECHNICAL FIELD

The present disclosure relates to the technical field of displaying, and particularly relates to a displaying base plate and a fabricating method thereof, and a display panel.

BACKGROUND

With the deep development of the technology of quantum dot, the study on Quantum Dot Light Emitting Diodes (QLED) is increasingly maturing, and the quantum efficiency is increasingly increasing, and has substantially reached the level for industrial production.

The approaches of the patterning of quantum dots mainly include printing, transfer printing and so on. Currently, the most mature use is printing, which may directly employ Organic Light-Emitting Diode (OLED) printing devices.

SUMMARY

The embodiments of the present disclosure provide a displaying base plate and a fabricating method thereof, and a display panel.

The embodiments of the present disclosure employ the following technical solutions:

In an aspect, there is provided a displaying base plate, wherein the displaying base plate comprises: a plurality of pixels that are arranged in an array, wherein each of the pixels comprises a first sub-pixel, a second sub-pixel and a third sub-pixel that have different luminous colors;

the first sub-pixel comprises a first electrode, a first inorganic layer and a first quantum-dot layer that are sequentially stacked, wherein the first inorganic layer comprises a first inorganic material modified by a first radical group, and the first quantum-dot layer comprises a first quantum dot modified by a first ligand, wherein a wettability of the first radical group and a wettability of the first ligand are the same;

the second sub-pixel comprises a second electrode, a second inorganic layer and a second quantum-dot layer that are sequentially stacked, wherein the second inorganic layer comprises a second inorganic material modified by a second radical group, and the second quantum-dot layer comprises a second quantum dot modified by a second ligand, wherein a wettability of the second radical group and a wettability of the second ligand are the same; and the third sub-pixel comprises a third electrode, a third inorganic layer and a third quantum-dot layer that are sequentially stacked, wherein the third inorganic layer comprises a third inorganic material modified by a third radical group, and the third quantum-dot layer comprises a third quantum dot modified by a third ligand, wherein a wettability of the third radical group and a wettability of the third ligand are the same;

wherein each two of the wettability of the first radical group, the wettability of the second radical group and the wettability of the third radical group are different, and each two of the wettability of the first ligand, the wettability of the second ligand and the wettability of the third ligand are different.

Optionally, the first radical group is a hydrophilic group, the second radical group is a lipophilic group, and the third radical group is a hydrophobic lipophobic group; and the first ligand is a hydrophilic ligand, the second ligand is a lipophilic ligand, and the third ligand is a hydrophobic lipophobic ligand.

Optionally, the first radical group comprises any one of hydroxyl, amino and $(OCH_2CH_2)_n$, the second radical group comprises hydrocarbonyl or aryl, and the third radical group comprises a fluorohydrocarbon group or a perfluoro group.

Optionally, the first ligand comprises mercaptoacetic acid, the second ligand comprises octanethiol, and the third ligand comprises perfluorooctanic acid.

Optionally, the first sub-pixel is a red-color sub-pixel, and the first quantum-dot layer is a red-color quantum-dot layer;

the second sub-pixel is a green-color sub-pixel, and the second quantum-dot layer is a green-color quantum-dot layer; and the third sub-pixel is a blue-color sub-pixel, and the third quantum-dot layer is a blue-color quantum-dot layer.

Optionally, all of the first electrode, the second electrode and the third electrode are an anode, and all of the first inorganic layer, the second inorganic layer and the third inorganic layer are a hole transporting layer.

Optionally, the first sub-pixel further comprises: a hole injection layer located between the first electrode and the first inorganic layer, and an electron transporting layer, an electron injection layer and a cathode that are sequentially located over the first quantum-dot layer.

Optionally, all of the first electrode, the second electrode and the third electrode are a cathode, and all of the first inorganic layer, the second inorganic layer and the third inorganic layer are an electron transporting layer.

Optionally, the first sub-pixel further comprises: an electron injection layer located between the first electrode and the first inorganic layer, and a hole transporting layer, a hole injection layer and an anode that are sequentially located over the first quantum-dot layer.

Optionally, the first electrode, the second electrode and the third electrode are made from a metal oxide or a metal.

In another aspect, there is provided a display panel, wherein the display panel comprises the displaying base plate stated above.

In yet another aspect, there is provided a method for fabricating the displaying base plate stated above, wherein the method comprises:

forming the first electrode, the second electrode and the third electrode;

forming the first inorganic layer, the second inorganic layer and the third inorganic layer respectively on the first electrode, the second electrode and the third electrode, wherein the first inorganic layer comprises the first inorganic material modified by the first radical group, the second inorganic layer comprises the second inorganic material modified by the second radical group, and the third inorganic layer comprises the third inorganic material modified by the third radical group; and according to the different wettabilities of the first quantum-dot layer, the second quantum-dot layer and the third quantum-dot layer, forming the first quantum-dot layer, the second quantum-dot layer and the third quantum-dot layer respectively on the first inorganic layer, the second inorganic layer and the third inorganic layer, wherein the first quantum-dot layer comprises the first quantum dot modified by the first ligand, the second quantum-dot layer comprises the second quantum dot modified by the second ligand, and the third quantum-dot layer comprises the third quantum dot modified by the third ligand;

wherein each two of the wettability of the first radical group, the wettability of the second radical group and the wettability of the third radical group are different, each two of the wettability of the first ligand, the wettability of the second ligand and the wettability of the third ligand are different, a wettability of the first radical group and a wettability of the first ligand are the same, a wettability of the second radical group and a wettability of the second ligand are the same, and a wettability of the third radical group and a wettability of the third ligand are the same.

Optionally, the step of, according to the different wettabilities of the first quantum-dot layer, the second quantum-dot layer and the third quantum-dot layer, forming the first quantum-dot layer, the second quantum-dot layer and the third quantum-dot layer respectively on the first inorganic layer, the second inorganic layer and the third inorganic layer comprises:

forming a first quantum-dot solution, a second quantum-dot solution and a third quantum-dot solution, wherein the first quantum-dot solution comprises the first quantum dot modified by the first ligand, the second quantum-dot solution comprises the second quantum dot modified by the second ligand, and the third quantum-dot solution comprises the third quantum dot modified by the third ligand;

soaking the displaying base plate comprising the first inorganic layer, the second inorganic layer and the third inorganic layer into the first quantum-dot solution, to obtain the displaying base plate comprising the first quantum-dot layer;

soaking the displaying base plate comprising the first quantum-dot layer into the second quantum-dot solution, to obtain the displaying base plate comprising the first quantum-dot layer and the second quantum-dot layer; and soaking the displaying base plate comprising the first quantum-dot layer and the second quantum-dot layer into the third quantum-dot solution, to obtain the displaying base plate comprising the first quantum-dot layer, the second quantum-dot layer and the third quantum-dot layer.

Optionally, a thickness of the first quantum-dot layer is positively correlated with a concentration and a viscosity of the first quantum-dot solution;

a thickness of the second quantum-dot layer is positively correlated with a concentration and a viscosity of the second quantum-dot solution; and a thickness of the third quantum-dot layer is positively correlated with a concentration and a viscosity of the third quantum-dot solution.

Optionally, the first radical group is a hydrophilic group, the second radical group is a lipophilic group, and the third radical group is a hydrophobic lipophobic group; and the first ligand is a hydrophilic ligand, the second ligand is a lipophilic ligand, and the third ligand is a hydrophobic lipophobic ligand.

Optionally, the first quantum dot is a red-color quantum dot, the first ligand comprises mercaptoacetic acid, and a solvent of the first quantum-dot solution is ethanol;

the second quantum dot is a green-color quantum dot, the second ligand comprises octanethiol, and a solvent of the second quantum-dot solution is octane; and the third quantum dot is a blue-color quantum dot, the third ligand comprises perfluorooctanic acid, and a solvent of the third quantum-dot solution is perfluorooctane.

Optionally, the step of forming the first inorganic layer, the second inorganic layer and the third inorganic layer respectively on the first electrode, the second electrode and the third electrode comprises:

forming a first inorganic-precursor layer, a second inorganic-precursor layer and a third inorganic-precursor layer, wherein the first inorganic-precursor layer comprises the first inorganic material, the second inorganic-precursor layer comprises the second inorganic material, and the third inorganic-precursor layer comprises the third inorganic material; and printing a solution containing a Y1-SiX$_3$-type silane coupling agent, a solution containing a Y2-SiX$_3$-type silane coupling agent and a solution containing a Y3-SiX$_3$-type silane coupling agent respectively onto the first inorganic-precursor layer, the second inorganic-precursor layer and the third inorganic-precursor layer, and obtaining by reaction the first inorganic layer, the second inorganic layer and the third inorganic layer;

wherein the first inorganic layer comprises the first inorganic material modified by Y1, the second inorganic layer comprises the second inorganic material modified by Y2, and the third inorganic layer comprises the third inorganic material modified by Y3, wherein Y1 comprises any one of hydroxyl, amino and $(OCH_2CH_2)_n$, Y2 comprises hydrocarbonyl or aryl, Y3 comprises a fluorohydrocarbon group or a perfluoro group, and X comprises any one of chloro, OMe, OEt, β-methoxyethoxy, trimethylsiloxy and OAc.

Optionally, the Y1-SiX$_3$-type silane coupling agent is diethylenetriamino propyl trimethoxy silane, the Y2-SiX$_3$-type silane coupling agent is n-octyl trimethoxy silane, and the Y3-SiX$_3$-type silane coupling agent is tridecafluorooctyl trimethoxy silane; and all of the first inorganic layer, the second inorganic layer and the third inorganic layer are made from zinc oxide.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

DETAILED DESCRIPTION

Figure 1:
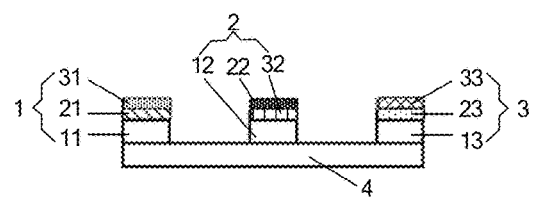
FIG. 1 is a schematic structural diagram of the displaying base plate according to an embodiment of the present disclosure.

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the embodiments of the present disclosure, terms such as "first", "second" and "third" are used to distinguish identical items or similar items that have substantially the same functions and effects, merely in order to clearly describe the technical solutions of the embodiments of the present disclosure, and should not be construed as indicating or implying the degrees of importance or the quantity of the specified technical features.

In the embodiments of the present disclosure, the meaning of "plurality of" is "two or more", unless explicitly and clearly defined otherwise.

In the embodiments of the present disclosure, the terms that indicate orientation or position relations, such as "upper" and "lower", are based on the orientation or position relations shown in the drawings, and are merely for conveniently describing the present disclosure and simplifying the description, rather than indicating or implying that the device or element must have the specific orientation and be constructed and operated according to the specific orientation. Therefore, they should not be construed as a limitation on the present disclosure.

An embodiment of the present disclosure provides a displaying base plate. The displaying base plate comprises: a plurality of pixels that are arranged in an array. Referring to FIG. 1, each of the pixels comprises a first sub-pixel 1, a second sub-pixel 2 and a third sub-pixel 3 that have different luminous colors.

The first sub-pixel 1 comprises a first electrode 11, a first inorganic layer 21 and a first quantum-dot layer 31 that are sequentially stacked. The first inorganic layer comprises a first inorganic material modified by a first radical group, and the first quantum-dot layer comprises a first quantum dot modified by a first ligand, wherein the wettability of the first radical group and the wettability of the first ligand are the same.

The second sub-pixel 2 comprises a second electrode 12, a second inorganic layer 22 and a second quantum-dot layer 32 that are sequentially stacked. The second inorganic layer comprises a second inorganic material modified by a second radical group, and the second quantum-dot layer comprises a second quantum dot modified by a second ligand, wherein the wettability of the second radical group and the wettability of the second ligand are the same.

The third sub-pixel 3 comprises a third electrode 13, a third inorganic layer 23 and a third quantum-dot layer 33 that are sequentially stacked. The third inorganic layer comprises a third inorganic material modified by a third radical group, and the third quantum-dot layer comprises a third quantum dot modified by a third ligand, wherein the wettability of the third radical group and the wettability of the third ligand are the same.

Each two of the wettability of the first radical group, the wettability of the second radical group and the wettability of the third radical group are different, and each two of the wettability of the first ligand, the wettability of the second ligand and the wettability of the third ligand are different.

The luminous colors of the first sub-pixel, the second sub-pixel and the third sub-pixel are different. The first sub-pixel, the second sub-pixel and the third sub-pixel may individually be any one of a red-color (R) sub-pixel, a green-color (G) sub-pixel or a blue-color (B) sub-pixel. The particular luminous colors of the first sub-pixel, the second sub-pixel and the third sub-pixel are not limited herein. As an example, the first sub-pixel may be a red-color (R) sub-pixel; in this case, the second sub-pixel may be a green-color (G) sub-pixel, and the third sub-pixel may be a blue-color (B) sub-pixel.

The first electrode, the second electrode and the third electrode may be provided in the same layer, and are all used as cathodes or anodes. Their materials may be a metal oxide, such as indium tin oxide (ITO), or a metal, such as copper and silver.

The particular wettabilities and structures of the first radical group, the second radical group and the third radical group are not limited herein. The first radical group, the second radical group and the third radical group may individually be any one of a hydrophilic group, a lipophilic group and a hydrophobic lipophobic group. As an example, the first radical group may be a hydrophilic group; in this case, the second radical group may be a lipophilic group, and the third radical group may be a hydrophobic lipophobic group.

The hydrophilic group, the lipophilic group and the hydrophobic lipophobic group will be individually explained below.

Hydrophilic groups have an excellent wettability to polar solvents such as water and alcohols (in other words, they are solvable in polar solvents such as water and alcohols), and have a very poor wettability to non-polar solvents and fluorinated solvents (in other words, they are indissolvable in non-polar solvents and fluorinated solvents).

Lipophilic groups have an excellent wettability to non-polar solvents such as alkanes and xylenes (in other words, they are solvable in non-polar solvents such as alkanes and xylenes), and have a very poor wettability to polar solvents and fluorinated solvents (in other words, they are indissolvable in polar solvents and fluorinated solvents).

Hydrophobic lipophobic groups (such as fluorohydrocarbon groups or perfluoro groups) have an excellent wettability to fluorinated solvents such as perfluorooctane, hexafluorobenzene and ethyl nonafluorobutyl ether (in other words, they are solvable in fluorinated solvents such as perfluorooctane, hexafluorobenzene and ethyl nonafluorobutyl ether, and have a very poor wettability to non-polar solvents such as alkanes and xylenes and polar solvents such as water and alcohols (in other words, they are indissolvable in non-polar solvents such as alkanes and xylenes and polar solvents such as water and alcohols).

If the first radical group is a hydrophilic group, the second radical group is a lipophilic group, and the third radical group is a hydrophobic lipophobic group, then the first inorganic layer is solvable in polar solvents such as water and alcohols, and is indissolvable in non-polar solvents and fluorinated solvents; the second inorganic layer is solvable in non-polar solvents such as alkanes and xylenes, and is indissolvable in polar solvents and fluorinated solvents; and the third inorganic layer is solvable in fluorinated solvents such as perfluorooctane, hexafluorobenzene and ethyl nonafluorobutyl ether, and is indissolvable in non-polar solvents such as alkanes and xylenes and polar solvents such as water and alcohols. Here, the wettabilities of the first inorganic layer, the second inorganic layer and the third inorganic layer are explained by merely taking the case in which the first radical group is a hydrophilic group, the second radical group is a lipophilic group and the third radical group is a hydrophobic lipophobic group as an example. If the first radical group, the second radical group and the third radical group are changed, correspondingly, the wettabilities of the first inorganic layer, the second inorganic layer and the third inorganic layer will be changed.

The particular wettabilities and structures of the first ligand, the second ligand and the third ligand are not limited herein. The first ligand, the second ligand and the third ligand may individually be any one of a hydrophilic ligand, a lipophilic ligand and a hydrophobic lipophobic ligand. As an example, the first ligand may be a hydrophilic ligand; in this case, the second ligand may be a lipophilic ligand, and the third ligand may be a hydrophobic lipophobic ligand.

The wettability of the hydrophilic ligand is similar to that of the hydrophilic group, the wettability of the lipophilic ligand is similar to that of the lipophilic group, and the wettability of the hydrophobic lipophobic ligand is similar to that of the hydrophobic lipophobic group, which is not explained in detail herein.

If both of the first radical group and the first ligand are hydrophilic groups, both of the second radical group and the second ligand are lipophilic groups, and both of the third radical group and the third ligand are hydrophobic lipophobic groups, then the first inorganic layer and the first quantum-dot layer can adsorb each other, the second inorganic layer and the second quantum-dot layer can adsorb each other, and the third inorganic layer and the third quantum-dot layer can adsorb each other.

In the displaying base plate, the wettabilities of the surface of the first inorganic layer of the first sub-pixel, the surface of the second inorganic layer of the second sub-pixel and the surface of the third inorganic layer of the third sub-pixel have been changed. At the same time, the wettabilities of the surface of the first quantum-dot layer of the first sub-pixel, the surface of the second quantum-dot layer of the second sub-pixel and the surface of the third quantum-dot layer of the third sub-pixel have also been changed. Furthermore, the wettabilities of the surface of the first quantum-dot layer and the surface of the first inorganic layer of the first sub-pixel are the same, the wettabilities of the surface of the second quantum-dot layer and the surface of the second inorganic layer of the second sub-pixel are the same, and the wettabilities of the surface of the third quantum-dot layer and the surface of the third inorganic layer of the third sub-pixel are the same. Accordingly, in the fabrication of the displaying base plate by transfer printing, the large-area transfer printing of a quantum-dot pattern can be realized by utilizing the different wettabilities of the surfaces of the inorganic layers and the different wettabilities of the surfaces of the quantum-dot layers of the different sub-pixels. The fabricating method does not require traditional high-accuracy templates, greatly reduces the cost, and can be used in the large-area transfer printing of a quantum-dot pattern.

Optionally, the first radical group is a hydrophilic group, the second radical group is a lipophilic group, and the third radical group is a hydrophobic lipophobic group; and the first ligand is a hydrophilic ligand, the second ligand is a lipophilic ligand, and the third ligand is a hydrophobic lipophobic ligand (for example, a fluorinated-solvent-philic ligand). In this case, the first inorganic layer is solvable in polar solvents such as water and alcohols, and is indissolvable in non-polar solvents and fluorinated solvents; the second inorganic layer is solvable in non-polar solvents such as alkanes and xylenes, and is indissolvable in polar solvents and fluorinated solvents; and the third inorganic layer is solvable in fluorinated solvents such as perfluorooctane, hexafluorobenzene and ethyl nonafluorobutyl ether, and is indissolvable in non-polar solvents such as alkanes and xylenes and polar solvents such as water and alcohols. In addition, the first inorganic layer and the first quantum-dot layer can adsorb each other, the second inorganic layer and the second quantum-dot layer can adsorb each other, and the third inorganic layer and the third quantum-dot layer can adsorb each other.

Optionally, the first radical group comprises any one of hydroxyl (whose chemical formula is —OH), amino (whose chemical formula is —$NH_2$) and ($OCH_2CH_2$)$_n$ (oxy-1,2-ethanediyl), the second radical group comprises hydrocarbonyl or aryl, and the third radical group comprises a fluorohydrocarbon group or a perfluoro group. Both of the fluorohydrocarbon group or the perfluoro group are fluorine-containing groups.

Optionally, the first ligand comprises mercaptoacetic acid, which is a hydrophilic ligand; the second ligand comprises octanethiol, which is a lipophilic ligand; and the third ligand comprises perfluorooctanic acid, which is a hydrophobic lipophobic ligand.

Optionally, the first sub-pixel is a red-color sub-pixel, and the first quantum-dot layer is a red-color quantum-dot layer (RQD); the second sub-pixel is a green-color sub-pixel, and the second quantum-dot layer is a green-color quantum-dot layer (GQD); and the third sub-pixel is a blue-color sub-pixel, and the third quantum-dot layer is a blue-color quantum-dot layer (BQD).

Therefore, in the first sub-pixel, the red-color quantum-dot layer may emit red light; in the second sub-pixel, the green-color quantum-dot layer may emit green light; and in the third sub-pixel, the blue-color quantum-dot layer may emit blue light. The materials of the red-color quantum-dot layer, the green-color quantum-dot layer and the blue-color quantum-dot layer are not limited herein. As an example, the materials of the first quantum dot, the second quantum dot and the third quantum dot may be a perovskite crystal material, a composite containing a metal nanoparticle, and so on.

Optionally, all of the first electrode, the second electrode and the third electrode are an anode, and all of the first inorganic layer, the second inorganic layer and the third inorganic layer are a hole transporting layer.

The material of the hole transporting layer is not limited herein. As an example, the material of the hole transporting layer may be nickel oxide (NiO). The hole transporting layer facilitates to transport holes, to increase the luminous efficiency.

In this case, the first sub-pixel may further comprise a hole injection layer located between the first electrode and the first inorganic layer, and an electron transporting layer, an electron injection layer and a cathode that are sequentially located over the first quantum-dot layer. The structures of the second sub-pixel and the third sub-pixel are similar to that of the first sub-pixel, and are not discussed herein further.

Alternatively, all of the first electrode, the second electrode and the third electrode are a cathode, and all of the first inorganic layer, the second inorganic layer and the third inorganic layer are an electron transporting layer.

The material of the electron transporting layer is not limited herein. As an example, the material of the electron transporting layer may be zinc oxide (ZnO). The electron transporting layer facilitates to transport electrons, to increase the luminous efficiency.

In this case, the first sub-pixel may further comprise an electron injection layer located between the first electrode and the first inorganic layer, and a hole transporting layer, a hole injection layer and an anode that are sequentially located over the first quantum-dot layer. The structures of the second sub-pixel and the third sub-pixel are similar to that of the first sub-pixel, and are not discussed herein further.

An embodiment of the present disclosure provides a display panel, wherein the display panel comprises the displaying base plate according to the above embodiments. The display panel may be a QLED display panel, and may also be any products or components having a displaying function that comprise the QLED display panel, such as a television set, a digital camera, a mobile phone and a tablet personal computer. The display panel has the advantages of a high resolution and a good displaying performance.

An embodiment of the present disclosure provides a method for fabricating the displaying base plate according to the above embodiments, wherein the method comprises:

S01: forming the first electrode, the second electrode and the third electrode.

Figure 2:
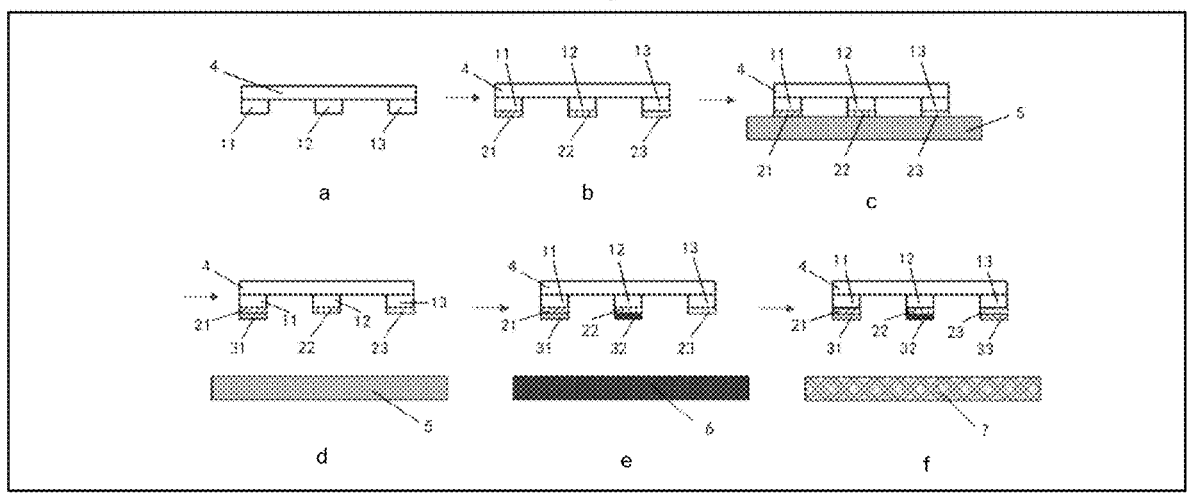
FIG. 2 is a schematic flow chart of the fabrication of the displaying base plate according to an embodiment of the present disclosure.

As an example, referring to FIG. 2a, the first electrode 11, the second electrode 12 and the third electrode 13 are formed on one side of a substrate 4. Particularly, the process may comprise depositing electrode thin films on the substrate 4, and then patterning to form the first electrode, the second electrode and the third electrode.

S02: forming the first inorganic layer, the second inorganic layer and the third inorganic layer respectively on the first electrode, the second electrode and the third electrode, wherein the first inorganic layer comprises the first inorganic material modified by the first radical group, the second inorganic layer comprises the second inorganic material modified by the second radical group, and the third inorganic layer comprises the third inorganic material modified by the third radical group.

As an example, referring to FIG. 2b, the first inorganic layer 21, the second inorganic layer 22 and the third inorganic layer 23 are formed on the sides of respectively the first electrode 11, the second electrode 12 and the third electrode 13 that are further away from the substrate 4.

S03: according to the different wettabilities of the first quantum-dot layer, the second quantum-dot layer and the third quantum-dot layer, forming the first quantum-dot layer, the second quantum-dot layer and the third quantum-dot layer respectively on the first inorganic layer, the second inorganic layer and the third inorganic layer, wherein the first quantum-dot layer comprises the first quantum dot modified by the first ligand, the second quantum-dot layer comprises the second quantum dot modified by the second ligand, and the third quantum-dot layer comprises the third quantum dot modified by the third ligand.

The particular forming method of S03 is not limited herein. As an example, referring to FIGS. 2b-f, the first quantum-dot layer 31, the second quantum-dot layer 32 and the third quantum-dot layer 33 are formed on the sides of respectively the first inorganic layer 21, the second inorganic layer 22 and the third inorganic layer 23 that are further away from the substrate 4.

Each two of the wettability of the first radical group, the wettability of the second radical group and the wettability of the third radical group are different, each two of the wettability of the first ligand, the wettability of the second ligand and the wettability of the third ligand are different, a wettability of the first radical group and a wettability of the first ligand are the same, a wettability of the second radical group and a wettability of the second ligand are the same, and a wettability of the third radical group and a wettability of the third ligand are the same.

In the displaying base plate formed by using the above fabricating method, the wettabilities of the surface of the first inorganic layer of the first sub-pixel, the surface of the second inorganic layer of the second sub-pixel and the surface of the third inorganic layer of the third sub-pixel have been changed. At the same time, the wettabilities of the surface of the first quantum-dot layer of the first sub-pixel, the surface of the second quantum-dot layer of the second sub-pixel and the surface of the third quantum-dot layer of the third sub-pixel have also been changed. Furthermore, the wettabilities of the surface of the first quantum-dot layer and the surface of the first inorganic layer of the first sub-pixel are the same, the wettabilities of the surface of the second quantum-dot layer and the surface of the second inorganic layer of the second sub-pixel are the same, and the wettabilities of the surface of the third quantum-dot layer and the surface of the third inorganic layer of the third sub-pixel are the same. The fabricating method, according to the different wettabilities of the first quantum-dot layer, the second quantum-dot layer and the third quantum-dot layer, realizes the fabrication of the different quantum-dot layers. The fabricating method does not require traditional high-accuracy templates, greatly reduces the cost, and can be used in the large-area transfer printing of a quantum-dot pattern.

Optionally, the step S03 of, according to the different wettabilities of the first quantum-dot layer, the second quantum-dot layer and the third quantum-dot layer, forming the first quantum-dot layer, the second quantum-dot layer and the third quantum-dot layer respectively on the first inorganic layer, the second inorganic layer and the third inorganic layer comprises:

S031: forming a first quantum-dot solution, a second quantum-dot solution and a third quantum-dot solution, wherein the first quantum-dot solution comprises the first quantum dot modified by the first ligand, the second quantum-dot solution comprises the second quantum dot modified by the second ligand, and the third quantum-dot solution comprises the third quantum dot modified by the third ligand.

S032: soaking the displaying base plate comprising the first inorganic layer, the second inorganic layer and the third inorganic layer into the first quantum-dot solution, to obtain the displaying base plate comprising the first quantum-dot layer.

As an example, referring to FIG. 2c, at the room temperature 25° C., the displaying base plate comprising the first inorganic layer 21, the second inorganic layer 22 and the third inorganic layer 23 is soaked into the first quantum-dot solution 5, wherein the soaking duration is in the range of 10-30 s (for example, the soaking duration may be 10 s, 20 s, 30 s and so on). After the first inorganic layer 21 has sufficiently adsorbed the first quantum-dot solution 5, the displaying base plate is taken out of the first quantum-dot solution 5, and dried, to obtain the displaying base plate comprising the first quantum-dot layer 31 shown in FIG. 2d.

The thickness of the first quantum-dot layer mainly depends on the concentration of the first quantum-dot solution, wherein if the concentration of the first quantum-dot solution is higher, the thickness of the first quantum-dot layer is larger. The particular concentration of the first quantum-dot solution and the thickness of the first quantum-dot layer are not limited herein. As an example, the concentration of the first quantum-dot solution is in the range of 10-100 mg/ml (for example, the concentration of the first quantum-dot solution may be 10 mg/ml, 20 mg/ml, 40 mg/ml, 60 mg/ml, 80 mg/ml, 100 mg/ml and so on), and the thickness of the first quantum-dot layer is in the range of 10-50 nm (for example, the thickness of the first quantum-dot layer may be 10 nm, 20 nm, 30 nm, 40 nm, 50 nm and so on). Certainly, the thickness of the first quantum-dot layer may also depend on the viscosity of the first quantum-dot solution, wherein the viscosity of the first quantum-dot solution is positively correlated with the thickness of the first quantum-dot layer. Therefore, first quantum-dot layers of different thicknesses may be obtained by controlling the concentration of the first quantum-dot solution and the viscosity of the first quantum-dot solution.

Because a hydrophilic system, a lipophilic system and a hydrophobic lipophobic system are immiscible, merely a solution and a material that have the same property can adsorb each other. As an example, both of the first radical group of the first inorganic layer and the first ligand of the first quantum-dot solution are hydrophilic, the second radical group of the second inorganic layer is lipophilic, and the third radical group of the third inorganic layer is hydrophobic and lipophobic and has a fluorinated-solvent-philic characteristic. Therefore, in S032, the first inorganic layer can adsorb the first quantum-dot solution, and the second inorganic layer and the third inorganic layer cannot adsorb the first quantum-dot solution.

S033: soaking the displaying base plate comprising the first quantum-dot layer into the second quantum-dot solution, to obtain the displaying base plate comprising the first quantum-dot layer and the second quantum-dot layer.

As an example, at the room temperature 25° C., the displaying base plate comprising the first quantum-dot layer is soaked into the second quantum-dot solution 6 shown in FIG. 2e, wherein the soaking duration is in the range of 10-30 s (for example, the soaking duration may be 10 s, 20 s, 30 s and so on). After the second inorganic layer 21 has sufficiently adsorbed the second quantum-dot solution 6, the displaying base plate is taken out of the second quantum-dot solution 6, and dried, to obtain the displaying base plate comprising the first quantum-dot layer 31 and the second quantum-dot layer 32 shown in FIG. 2e.

The thickness of the second quantum-dot layer mainly depends on the concentration of the second quantum-dot solution, wherein if the concentration of the second quantum-dot solution is higher, the thickness of the second quantum-dot layer is larger. The particular concentration of the second quantum-dot solution and the thickness of the second quantum-dot layer are not limited herein. As an example, the concentration of the second quantum-dot solution is in the range of 10-100 mg/ml (for example, the concentration of the second quantum-dot solution may be 10 mg/ml, 20 mg/ml, 40 mg/ml, 60 mg/ml, 80 mg/ml, 100 mg/ml and so on), and the thickness of the second quantum-dot layer is in the range of 10-50 nm (for example, the thickness of the second quantum-dot layer may be 10 nm, 20 nm, 30 nm, 40 nm, 50 nm and so on). Certainly, the thickness of the second quantum-dot layer may also depend on the viscosity of the second quantum-dot solution, wherein the viscosity of the second quantum-dot solution is positively correlated with the thickness of the second quantum-dot layer. Therefore, second quantum-dot layers of different thicknesses may be obtained by controlling the concentration of the second quantum-dot solution and the viscosity of the second quantum-dot solution.

Because both of the second radical group of the second inorganic layer and the second ligand of the second quantum-dot solution are lipophilic, the first radical group of the first inorganic layer is hydrophilic, and the third radical group of the third inorganic layer is hydrophobic and lipophobic and has a fluorinated-solvent-philic characteristic, in S033, the second inorganic layer can adsorb the second quantum-dot solution, and the first inorganic layer and the third inorganic layer cannot adsorb the second quantum-dot solution.

S034: soaking the displaying base plate comprising the first quantum-dot layer and the second quantum-dot layer into the third quantum-dot solution, to obtain the displaying base plate comprising the first quantum-dot layer, the second quantum-dot layer and the third quantum-dot layer.

As an example, at the room temperature 25° C., the displaying base plate comprising the first quantum-dot layer and the second quantum-dot layer is soaked into the third quantum-dot solution 7 shown in FIG. 2f, wherein the soaking duration is in the range of 10-30 s (for example, the soaking duration may be 10 s, 20 s, 30 s and so on). After the third inorganic layer 23 has sufficiently adsorbed the third quantum-dot solution 7, the displaying base plate is taken out of the third quantum-dot solution 7, and dried, to obtain the displaying base plate comprising the first quantum-dot layer 31, the second quantum-dot layer 32 and the third quantum-dot layer 33.

The thickness of the third quantum-dot layer mainly depends on the concentration of the third quantum-dot solution, wherein if the concentration of the third quantum-dot solution is higher, the thickness of the third quantum-dot layer is larger. The particular concentration of the third quantum-dot solution and the thickness of the third quantum-dot layer are not limited herein. As an example, the concentration of the third quantum-dot solution is in the range of 10-100 mg/ml (for example, the concentration of the third quantum-dot solution may be 10 mg/ml, 20 mg/ml, 40 mg/ml, 60 mg/ml, 80 mg/ml, 100 mg/ml and so on), and the thickness of the third quantum-dot layer is in the range of 10-50 nm (for example, the thickness of the third quantum-dot layer may be 10 nm, 20 nm, 30 nm, 40 nm, 50 nm and so on). Certainly, the thickness of the third quantum-dot layer may also depend on the viscosity of the third quantum-dot solution, wherein the viscosity of the third quantum-dot solution is positively correlated with the thickness of the third quantum-dot layer. Therefore, third quantum-dot layers of different thicknesses may be obtained by controlling the concentration of the third quantum-dot solution and the viscosity of the third quantum-dot solution.

Because both of the third radical group of the third inorganic layer and the third ligand of the third quantum-dot solution are hydrophobic and lipophobic and have a fluorinated-solvent-philic characteristic, the first radical group of the first inorganic layer is hydrophilic, and the second radical group of the second inorganic layer is lipophilic, in S034, the third inorganic layer can adsorb the third quantum-dot solution, and the first inorganic layer and the second inorganic layer cannot adsorb the third quantum-dot solution.

It should be noted that the thickness of the first quantum-dot layer formed in S032, the thickness of the second quantum-dot layer formed in S033 and the thickness of the third quantum-dot layer formed in S034 may be the same or different, which may be particularly determined according to practical demands.

Accordingly, in the fabrication of the displaying base plate by transfer printing, S031-S034, by utilizing the different wettabilities of the surfaces of the inorganic layers and the different wettabilities of the surfaces of the quantum-dot layers of the different sub-pixels, realize the large-area transfer printing of a quantum-dot pattern. The fabricating method does not require traditional high-accuracy templates, and greatly reduces the cost.

Optionally, the first radical group is a hydrophilic group, the second radical group is a lipophilic group, and the third radical group is a hydrophobic lipophobic group; and the first ligand is a hydrophilic ligand, the second ligand is a lipophilic ligand, and the third ligand is a hydrophobic lipophobic ligand.

Optionally, the first quantum dot is a red-color quantum dot, the first ligand comprises mercaptoacetic acid, and a solvent of the first quantum-dot solution is ethanol. Mercaptoacetic acid is hydrophilic.

The second quantum dot is a green-color quantum dot, the second ligand comprises octanethiol, and a solvent of the second quantum-dot solution is octane. Octanethiol is lipophilic.

The third quantum dot is a blue-color quantum dot, the third ligand comprises perfluorooctanic acid, and a solvent of the third quantum-dot solution is perfluorooctane. Perfluorooctanic acid is hydrophobic and lipophobic, and has a fluorinated-solvent-philic characteristic.

The above ligand materials and solvent materials can be easily obtained, which facilitates mass production.

Optionally, the step S02 of forming the first inorganic layer, the second inorganic layer and the third inorganic layer respectively on the first electrode, the second electrode and the third electrode comprises:

S021: forming a first inorganic-precursor layer, a second inorganic-precursor layer and a third inorganic-precursor layer, wherein the first inorganic-precursor layer comprises the first inorganic material, the second inorganic-precursor layer comprises the second inorganic material, and the third inorganic-precursor layer comprises the third inorganic material.

S022: printing a solution containing a Y1-SiX$_3$-type silane coupling agent, a solution containing a Y2-SiX$_3$-type silane coupling agent and a solution containing a Y3-SiX$_3$-type silane coupling agent respectively onto the first inorganic-precursor layer, the second inorganic-precursor layer and the third inorganic-precursor layer, and obtaining by reaction the first inorganic layer, the second inorganic layer and the third inorganic layer.

The first inorganic layer comprises the first inorganic material modified by Y1, the second inorganic layer comprises the second inorganic material modified by Y2, and the third inorganic layer comprises the third inorganic material modified by Y3; and Y1 comprises any one of hydroxyl (whose chemical formula is —OH), amino (whose chemical formula is —NH$_2$) and (OCH$_2$CH$_2$)$_n$ (oxy-1,2-ethanediyl), Y2 comprises hydrocarbonyl or aryl, Y3 comprises a fluorohydrocarbon group or a perfluoro group, and X comprises any one of chloro (Cl), OMe, OEt, β-methoxyethoxy (OC$_2$H$_4$OCH$_3$), trimethylsiloxy (OSiMe$_3$) and OAc.

After the Y1-SiX$_3$-type silane coupling agent has been hydrolyzed, it reacts with the hydroxyl on the surface of the first inorganic-precursor layer, to obtain the first inorganic material modified by Y1. After the Y2-SiX$_3$-type silane coupling agent has been hydrolyzed, it reacts with the hydroxyl on the surface of the second inorganic-precursor layer, to obtain the second inorganic material modified by Y2. After the Y3-SiX$_3$-type silane coupling agent has been hydrolyzed, it reacts with the hydroxyl on the surface of the third inorganic-precursor layer, to obtain the third inorganic material modified by Y3. Here, taking the case in which X=OMe as an example, the mechanism of the hydrolysis is Y—Si(OMe)$_3$→Y—Si(OH)$_3$, and then the silanol moiety Si(OH)$_3$ can react with the hydroxyl on the surfaces of the inorganic-precursor layers, to finally obtain the inorganic materials modified by Y.

In the OMe, Me, in organic chemistry, is usually used to represent methyl, i.e., —CH$_3$. In the OEt, Et represents ethyl, i.e., CH$_3$CH$_2$—. In the OAc, Ac represents acetyl, i.e., CH$_3$—CO—.

The above method for forming the first inorganic layer, the second inorganic layer and the third inorganic layer is simple and easy to implement, and has a low cost. By using S021-S022, the formed first inorganic layer is hydrophilic, the second inorganic layer is lipophilic, and the third inorganic layer is hydrophobic and lipophobic, and has a fluorinated-solvent-philic characteristic.

Optionally, the Y1-SiX$_3$-type silane coupling agent is diethylenetriamino propyl trimethoxy silane, the Y2-SiX$_3$-type silane coupling agent is n-octyl trimethoxy silane, and the Y3-SiX$_3$-type silane coupling agent is tridecafluorooctyl trimethoxy silane. All of the first inorganic layer, the second inorganic layer and the third inorganic layer are made from zinc oxide (ZnO). In this case, the first inorganic layer, the second inorganic layer and the third inorganic layer are used as electron transporting layers, and the first electrode, the second electrode and the third electrode are used as cathodes.

Accordingly, the first radical group in the formed first inorganic layer is diethylenetriamino propyl, which is hydrophilic; the second radical group in the second inorganic layer is n-octyl, which is lipophilic; and the third radical group in the third inorganic layer is tridecafluorooctyl, which is hydrophobic and lipophobic, and has a fluorinated-solvent-philic characteristic.

The related description on the structure of the displaying base plate according to the present embodiment may refer to the above embodiments, and are not discussed herein further.

The above are merely particular embodiments of the present disclosure, and the protection scope of the present disclosure is not limited thereto. All of the variations or substitutions that a person skilled in the art can easily envisage within the technical scope disclosed by the present disclosure should fall within the protection scope of the present disclosure. Therefore, the protection scope of the present disclosure should be subject to the protection scope of the claims.

The invention claimed is:

1. A displaying base plate, wherein the displaying base plate comprises: a plurality of pixels that are arranged in an array, wherein each of the pixels comprises a first sub-pixel, a second sub-pixel and a third sub-pixel that have different luminous colors;

the first sub-pixel comprises a first electrode, a first inorganic layer and a first quantum-dot layer that are sequentially stacked, wherein the first inorganic layer comprises a first inorganic material modified by a first radical group, and the first quantum-dot layer comprises a first quantum dot modified by a first ligand, wherein a wettability of the first radical group and a wettability of the first ligand are the same;

the second sub-pixel comprises a second electrode, a second inorganic layer and a second quantum-dot layer that are sequentially stacked, wherein the second inorganic layer comprises a second inorganic material modified by a second radical group, and the second quantum-dot layer comprises a second quantum dot modified by a second ligand, wherein a wettability of the second radical group and a wettability of the second ligand are the same; and the third sub-pixel comprises a third electrode, a third inorganic layer and a third quantum-dot layer that are sequentially stacked, wherein the third inorganic layer comprises a third inorganic material modified by a third radical group, and the third quantum-dot layer comprises a third quantum dot modified by a third ligand, wherein a wettability of the third radical group and a wettability of the third ligand are the same;

wherein each two of the wettability of the first radical group, the wettability of the second radical group and the wettability of the third radical group are different, and each two of the wettability of the first ligand, the wettability of the second ligand and the wettability of the third ligand are different.

2. The displaying base plate according to claim 1, wherein the first radical group is a hydrophilic group, the second radical group is a lipophilic group, and the third radical group is a hydrophobic lipophobic group; and the first ligand is a hydrophilic ligand, the second ligand is a lipophilic ligand, and the third ligand is a hydrophobic lipophobic ligand.

3. The displaying base plate according to claim 2, wherein the first radical group comprises any one of hydroxyl, amino and $(OCH_2CH_2)_n$, the second radical group comprises hydrocarbonyl or aryl, and the third radical group comprises a fluorohydrocarbon group or a perfluoro group.

4. The displaying base plate according to claim 2, wherein the first ligand comprises mercaptoacetic acid, the second ligand comprises octanethiol, and the third ligand comprises perfluorooctanic acid.

5. The displaying base plate according to claim 1, wherein the first sub-pixel is a red-color sub-pixel, and the first quantum-dot layer is a red-color quantum-dot layer;

the second sub-pixel is a green-color sub-pixel, and the second quantum-dot layer is a green-color quantum-dot layer; and the third sub-pixel is a blue-color sub-pixel, and the third quantum-dot layer is a blue-color quantum-dot layer.

6. The displaying base plate according to claim 1, wherein all of the first electrode, the second electrode and the third electrode are an anode, and all of the first inorganic layer, the second inorganic layer and the third inorganic layer are a hole transporting layer.

7. The displaying base plate according to claim 6, wherein the first sub-pixel further comprises: a hole injection layer located between the first electrode and the first inorganic layer, and an electron transporting layer, an electron injection layer and a cathode that are sequentially located over the first quantum-dot layer.

8. The displaying base plate according to claim 1, wherein all of the first electrode, the second electrode and the third electrode are a cathode, and all of the first inorganic layer, the second inorganic layer and the third inorganic layer are an electron transporting layer.

9. The displaying base plate according to claim 8, wherein the first sub-pixel further comprises: an electron injection layer located between the first electrode and the first inorganic layer, and a hole transporting layer, a hole injection layer and an anode that are sequentially located over the first quantum-dot layer.

10. The displaying base plate according to claim 1, wherein the first electrode, the second electrode and the third electrode are made from a metal oxide or a metal.

11. A display panel, wherein the display panel comprises the displaying base plate according to claim 1.

12. A method for fabricating the displaying base plate according to claim 1, wherein the method comprises:

forming the first electrode, the second electrode and the third electrode;

forming the first inorganic layer, the second inorganic layer and the third inorganic layer respectively on the first electrode, the second electrode and the third electrode, wherein the first inorganic layer comprises the first inorganic material modified by the first radical group, the second inorganic layer comprises the second inorganic material modified by the second radical group, and the third inorganic layer comprises the third inorganic material modified by the third radical group; and according to the different wettabilities of the first quantum-dot layer, the second quantum-dot layer and the third quantum-dot layer, forming the first quantum-dot layer, the second quantum-dot layer and the third quantum-dot layer respectively on the first inorganic layer, the second inorganic layer and the third inorganic layer, wherein the first quantum-dot layer comprises the first quantum dot modified by the first ligand, the second quantum-dot layer comprises the second quantum dot modified by the second ligand, and the third quantum-dot layer comprises the third quantum dot modified by the third ligand;

wherein each two of the wettability of the first radical group, the wettability of the second radical group and the wettability of the third radical group are different, each two of the wettability of the first ligand, the wettability of the second ligand and the wettability of the third ligand are different, a wettability of the first radical group and a wettability of the first ligand are the same, a wettability of the second radical group and a wettability of the second ligand are the same, and a wettability of the third radical group and a wettability of the third ligand are the same.

13. The method according to claim 12, wherein the step of, according to the different wettabilities of the first quantum-dot layer, the second quantum-dot layer and the third quantum-dot layer, forming the first quantum-dot layer, the second quantum-dot layer and the third quantum-dot layer respectively on the first inorganic layer, the second inorganic layer and the third inorganic layer comprises:

forming a first quantum-dot solution, a second quantum-dot solution and a third quantum-dot solution, wherein the first quantum-dot solution comprises the first quantum dot modified by the first ligand, the second quantum-dot solution comprises the second quantum dot modified by the second ligand, and the third quantum-dot solution comprises the third quantum dot modified by the third ligand;

soaking the displaying base plate comprising the first inorganic layer, the second inorganic layer and the third inorganic layer into the first quantum-dot solution, to obtain the displaying base plate comprising the first quantum-dot layer;

soaking the displaying base plate comprising the first quantum-dot layer into the second quantum-dot solution, to obtain the displaying base plate comprising the first quantum-dot layer and the second quantum-dot layer; and soaking the displaying base plate comprising the first quantum-dot layer and the second quantum-dot layer into the third quantum-dot solution, to obtain the displaying base plate comprising the first quantum-dot layer, the second quantum-dot layer and the third quantum-dot layer.

14. The method according to claim 13, wherein a thickness of the first quantum-dot layer is positively correlated with a concentration and a viscosity of the first quantum-dot solution;
a thickness of the second quantum-dot layer is positively correlated with a concentration and a viscosity of the second quantum-dot solution; and
a thickness of the third quantum-dot layer is positively correlated with a concentration and a viscosity of the third quantum-dot solution.

15. The method according to claim 13, wherein the first radical group is a hydrophilic group, the second radical group is a lipophilic group, and the third radical group is a hydrophobic lipophobic group; and
the first ligand is a hydrophilic ligand, the second ligand is a lipophilic ligand, and the third ligand is a hydrophobic lipophobic ligand.

16. The method according to claim 15, wherein the first quantum dot is a red-color quantum dot, the first ligand comprises mercaptoacetic acid, and a solvent of the first quantum-dot solution is ethanol;
the second quantum dot is a green-color quantum dot, the second ligand comprises octanethiol, and a solvent of the second quantum-dot solution is octane; and
the third quantum dot is a blue-color quantum dot, the third ligand comprises perfluorooctanic acid, and a solvent of the third quantum-dot solution is perfluorooctane.

17. The method according to claim 15, wherein the step of forming the first inorganic layer, the second inorganic layer and the third inorganic layer respectively on the first electrode, the second electrode and the third electrode comprises:

forming a first inorganic-precursor layer, a second inorganic-precursor layer and a third inorganic-precursor layer, wherein the first inorganic-precursor layer comprises the first inorganic material, the second inorganic-precursor layer comprises the second inorganic material, and the third inorganic-precursor layer comprises the third inorganic material; and
printing a solution containing a Y1-SiX$_3$-type silane coupling agent, a solution containing a Y2-SiX$_3$-type silane coupling agent and a solution containing a Y3-SiX$_3$-type silane coupling agent respectively onto the first inorganic-precursor layer, the second inorganic-precursor layer and the third inorganic-precursor layer, and obtaining by reaction the first inorganic layer, the second inorganic layer and the third inorganic layer;
wherein the first inorganic layer comprises the first inorganic material modified by Y1, the second inorganic layer comprises the second inorganic material modified by Y2, and the third inorganic layer comprises the third inorganic material modified by Y3, wherein Y1 comprises any one of hydroxyl, amino and $(OCH_2CH_2)_n$, Y2 comprises hydrocarbonyl or aryl, Y3 comprises a fluorohydrocarbon group or a perfluoro group, and X comprises any one of chloro, OMe, OEt, β-methoxyethoxy, trimethylsiloxy and OAc.

18. The method according to claim 17, wherein the Y1-SiX$_3$-type silane coupling agent is diethylenetriamino propyl trimethoxy silane, the Y2-SiX$_3$-type silane coupling agent is n-octyl trimethoxy silane, and the Y3-SiX$_3$-type silane coupling agent is tridecafluorooctyl trimethoxy silane; and
all of the first inorganic layer, the second inorganic layer and the third inorganic layer are made from zinc oxide.

* * * * *